United States Patent
Muntal Diaz et al.

(10) Patent No.: US 11,954,413 B2
(45) Date of Patent: Apr. 9, 2024

(54) EVALUATING CANDIDATE VIRTUAL BUILD VOLUMES

(71) Applicant: Hewlett-Packard Development Company, L.P., Spring, TX (US)

(72) Inventors: Quim Muntal Diaz, Sant Cugat del Valles (ES); Manuel Freire Garcia, Sant Cugat del Valles (ES); Enrique Gurdiel Gonzalez, Sant Cugat del Valles (ES)

(73) Assignee: Hewlett-Packard Development Company, L.P., Spring, TX (US)

(*) Notice: Subject to any disclaimer, the term of this patent is extended or adjusted under 35 U.S.C. 154(b) by 124 days.

(21) Appl. No.: 17/263,216

(22) PCT Filed: Dec. 14, 2018

(86) PCT No.: PCT/US2018/065623
§ 371 (c)(1),
(2) Date: Jan. 26, 2021

(87) PCT Pub. No.: WO2020/122931
PCT Pub. Date: Jun. 18, 2020

(65) Prior Publication Data
US 2021/0294941 A1  Sep. 23, 2021

(51) Int. Cl.
*G06F 30/20* (2020.01)
*B29C 64/386* (2017.01)
(Continued)

(52) U.S. Cl.
CPC .............. *G06F 30/20* (2020.01); *G06F 30/10* (2020.01); *B29C 64/386* (2017.08); *B33Y 50/02* (2014.12)

(58) Field of Classification Search
CPC ......... G06F 30/20; G06F 30/10; B33Y 50/02; B29C 64/386
(Continued)

(56) References Cited

U.S. PATENT DOCUMENTS 6,980,934 B1 * 12/2005 Sadovnik ................ G06F 30/13
206/505
7,366,643 B2 * 4/2008 Verdura .................. G06F 30/00
703/7
(Continued)

FOREIGN PATENT DOCUMENTS

CN          106462994 A      2/2017
CN          107635750 A      1/2018
(Continued)

OTHER PUBLICATIONS

Arndt et al. (An Algorithm-Based Method !<'Or Process-Specific Threedimensional Nesting for Additive Manufacturing Processes, Technische Universitat Darmstadt, 2015, pp. 1-14) (Year: 2015).*
(Continued)

*Primary Examiner* — Iftekhar A Khan
(74) *Attorney, Agent, or Firm* — Michael Dryja

(57) ABSTRACT

In an example, a tangible machine-readable medium stores instructions which, when executed by a processor, cause the processor to evaluate a plurality of possible object generation arrangements based on a default separation distance and an enhanced separation distance, wherein the enhanced separation distance is used to assess predefined object sub-portions.

16 Claims, 5 Drawing Sheets

(51) Int. Cl.
*B33Y 50/02* (2015.01)
*G06F 30/10* (2020.01)

(58) Field of Classification Search
USPC .......................................................... 703/1
See application file for complete search history.

(56) References Cited

U.S. PATENT DOCUMENTS

| | | | | |
|---|---|---|---|---|
| 9,495,484 | B2* | 11/2016 | Griffith | G06F 30/00 |
| 9,636,871 | B2* | 5/2017 | Butler | B29C 64/386 |
| 9,993,873 | B2* | 6/2018 | Kovalcik | B33Y 50/02 |
| 10,078,325 | B2* | 9/2018 | Gunnarsson | B29C 64/386 |
| 2011/0293771 | A1* | 12/2011 | Oberhofer | B29C 64/364 |
| | | | | 425/182 |
| 2013/0076731 | A1* | 3/2013 | Rolleston | G06T 15/00 |
| | | | | 345/419 |
| 2014/0081603 | A1* | 3/2014 | Griffith | G06F 30/20 |
| | | | | 703/1 |
| 2015/0154321 | A1* | 6/2015 | Schmidt | B29C 64/40 |
| | | | | 700/98 |
| 2016/0136898 | A1* | 5/2016 | Jang | H04N 1/644 |
| | | | | 700/98 |
| 2016/0158962 | A1* | 6/2016 | Balistreri | B33Y 70/00 |
| | | | | 428/218 |
| 2016/0246293 | A1* | 8/2016 | Sakai | G05B 15/02 |
| 2016/0306901 | A1* | 10/2016 | Ainsworth | G06F 30/00 |
| 2016/0368220 | A1* | 12/2016 | Dimatteo | B29C 64/393 |
| 2017/0113414 | A1* | 4/2017 | Zeng | B33Y 30/00 |
| 2017/0165918 | A1* | 6/2017 | Yuji | G05B 19/4099 |
| 2017/0221237 | A1* | 8/2017 | Pate | G06T 11/206 |
| 2017/0252978 | A1* | 9/2017 | Claes | G05B 19/4099 |
| 2018/0024517 | A1* | 1/2018 | Halperin | G05B 19/4099 |
| | | | | 700/98 |
| 2018/0071986 | A1* | 3/2018 | Buller | B28B 1/001 |
| 2018/0133969 | A1* | 5/2018 | Huang | B29C 64/171 |
| 2019/0378566 | A1* | 12/2019 | Boniardi | H10N 70/8825 |
| 2020/0041441 | A1* | 2/2020 | Watanabe | G01N 27/41 |
| 2020/0055246 | A1* | 2/2020 | Günther | B41J 2/16508 |
| 2020/0298495 | A1* | 9/2020 | Manousakis | G06Q 10/08 |
| 2021/0039320 | A1* | 2/2021 | Tucker | G06F 30/20 |
| 2021/0060862 | A1* | 3/2021 | Lebron | B29C 64/165 |
| 2021/0170691 | A1* | 6/2021 | Lebron | G06F 30/20 |
| 2021/0197480 | A1* | 7/2021 | Hertling | B22F 10/30 |
| 2021/0200185 | A1* | 7/2021 | Shepherd | G06T 7/0004 |
| 2021/0201562 | A1* | 7/2021 | Shepherd | G06T 15/08 |
| 2021/0294941 | A1* | 9/2021 | Muntal Diaz | G06F 30/10 |
| 2021/0331403 | A1* | 10/2021 | Ramirez Muela | B29C 64/386 |

FOREIGN PATENT DOCUMENTS

| | | | | |
|---|---|---|---|---|
| CN | 107864639 | A | | 3/2018 |
| CN | 108025499 | A | | 5/2018 |
| WO | WO-2016033045 | A1 | | 3/2016 |
| WO | WO-2017023284 | A1 | * | 2/2017 ........... B29C 64/171 |
| WO | WO-2018182589 | A1 | | 10/2018 |
| WO | WO-2020122931 | A1 | * | 6/2020 ........... B29C 64/386 |

OTHER PUBLICATIONS

Netfabb GmbH, "Netfabb Professional 5.2 User Manual," XP-002748116, pp. 1, 68-73, Jul. 29, 2014.
Jingchao Jiang et al., "A New Support Strategy For Reducing Waste In Additive Manufacturing" The University of Auckland. ResearchGate, CIE48 Proceedings, Dec. 2-5, 2018.
Multi-Part Printing. Simplify3D Software [online], Jan. 2018 [retrieved on Aug. 30, 2019]. Retrieved from <http://web.archive.org/web/20180109215407/https://www.simplify3d.com.
Plater "3D-Printer Parts Placer And Plate Generator" [online][video], Jul. 2016 [retrieved on Aug, 12, 2019]. Retrieved from <http://web.archive.org/web/20160713191923/https://github.com.

* cited by examiner

EVALUATING CANDIDATE VIRTUAL BUILD VOLUMES

BACKGROUND

Additive manufacturing techniques may generate a three-dimensional object through the solidification of a build material, for example on a layer-by-layer basis. In examples of such techniques, build material may be supplied in a layer-wise manner and the solidification method may include heating the layers of build material to cause melting in selected regions. In other techniques, chemical solidification methods may be used.

BRIEF DESCRIPTION OF DRAWINGS

Non-limiting examples will now be described with reference to the accompanying drawings, in which.

DETAILED DESCRIPTION

Figure 1:
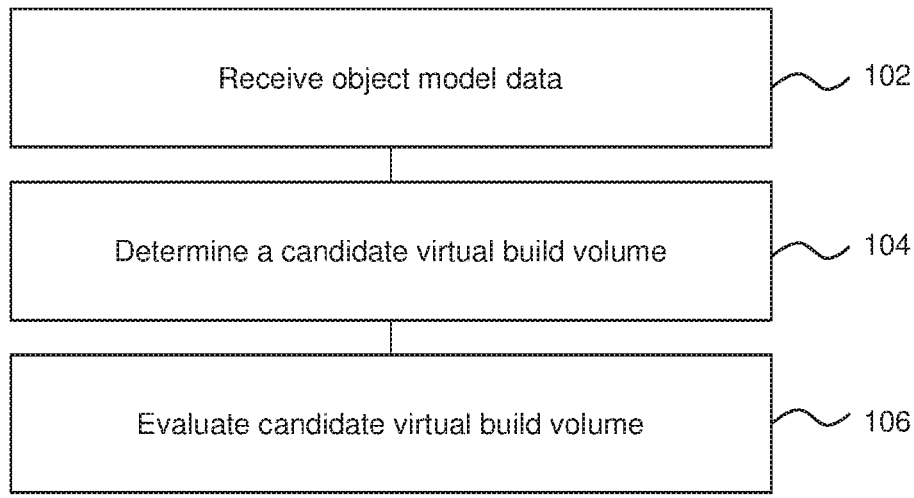
FIG. 1 is an example of a method of evaluating candidate virtual build volumes for additive manufacturing.

Additive manufacturing techniques may generate a three-dimensional object through the solidification of a build material. In some examples, the build material is a powder-like granular material, which may for example be a plastic, ceramic or metal powder and the properties of generated objects may depend on the type of build material and the type of solidification mechanism used. Build material may be deposited, for example on a print bed and processed layer by layer, for example within a fabrication chamber. According to one example, a suitable build material may be PA12 build material commercially known as V1R10A "HP PA12" available from HP Inc.

In some examples, selective solidification is achieved through directional application of energy, for example using a laser or electron beam which results in solidification of build material where the directional energy is applied. In other examples, at least one print agent may be selectively applied to the build material, and may be liquid when applied. For example, a fusing agent (also termed a 'coalescence agent' or 'coalescing agent') may be selectively distributed onto portions of a layer of build material in a pattern derived from data representing a slice of a three-dimensional object to be generated (which may for example be generated from structural design data). The fusing agent may have a composition which absorbs energy such that, when energy (for example, heat) is applied to the layer, the build material to which fusing agent has been applied heats up/melts, coalesces and solidifies to form a slice of the three-dimensional object in accordance with the pattern. In other examples, coalescence may be achieved in some other manner.

In an example, a suitable fusing agent may be an ink-type formulation comprising carbon black, such as, for example, the fusing agent formulation commercially known as V1Q60A "HP fusing agent" available from HP Inc. In some examples, a fusing agent may comprise at least one of an infra-red light absorber, a near infra-red light absorber, a visible light absorber and a UV light absorber. Examples of print agents comprising visible light enhancers are dye based colored ink and pigment based colored ink, such as inks commercially known as CE039A and CE042A available from HP Inc.

In some examples, a print agent may comprise a detailing agent, or coalescence modifier agent, which acts to modify the effects of a fusing agent for example by reducing (e.g. by cooling) or increasing coalescence or to assist in producing a particular finish or appearance to an object. Detailing agent may also be used to control thermal aspects of a layer of build material—e.g. to provide cooling. In some examples, detailing agent may be used near edge surfaces of an object being printed. According to one example, a suitable detailing agent may be a formulation commercially known as V1Q61A "HP detailing agent" available from HP Inc. A coloring agent, for example comprising a dye or colorant, may in some examples be used as a fusing agent or a coalescence modifier agent, and/or as a print agent to provide a particular color for the object. Print agents may control or influence other physical or appearance properties, such as strength, resilience, conductivity, transparency, surface texture or the like.

As noted above, additive manufacturing systems may generate objects based on structural design data. This may involve a designer generating a three-dimensional model of an object to be generated, for example using a computer aided design (CAD) application. The model may define the solid portions of the object. To generate a three-dimensional object from the model using an additive manufacturing system, the model data can be processed to generate slices defined between parallel planes of the model. Each slice may define a portion of a respective layer of build material that is to be solidified or caused to coalesce by the additive manufacturing system.

In some examples, it may be intended to manufacture objects to a high dimensional accuracy.

FIG. 1 is an example of a method, which may comprise a computer implemented method and/or a method of evaluating a candidate arrangement of object(s) to be generated within a build volume of an additive manufacturing apparatus. The candidate arrangement may be referred to as a 'candidate virtual build volume' as it models, or virtually represents, a possible placement of object(s) which may be generated in a build volume (or fabrication chamber) of an additive manufacturing apparatus.

Block 102 comprises receiving, by at least one processor, object model data. The object model data describes at least a first object to be generated in additive manufacturing, and may in some examples describe a plurality of objects. In some examples, the object model data may be received from a memory, over a network or the like. In some examples, the object model data may describe at least the geometry of object(s) to be generated, for example in the form of a vector model, a mesh model or a voxel model of the object(s). In some examples, the object model data may describe intended object properties, such as color, strength, density and the like.

Block 104 comprises determining, by at least one processor (which may comprise the same processor(s) as performs block 102), a candidate virtual build volume indicating a possible placement and orientation of a plurality of objects including the first object in object generation.

In other words, the candidate virtual build volume models an actual build volume (or fabrication chamber) which could result after carrying out an additive manufacturing operation. For example, this may specify the placement of the first object within the build volume (for example, its location in three-dimensional space, which may be expressed using xyz coordinates relative to an origin, which may be defined as a corner of the build volume), and in some examples, its placement relative to other objects to be generated within the build volume in the same possible object generation operation. The orientation of the object(s) may also be specified. Thus, the orientation of an object during generation may not be constrained to the intended orientation in use—objects may be generated 'upside down', or on their sides or in some other way.

Block 106 comprises evaluating, by at least one processor (which may comprise the same processor(s) as that which performs block 102 and/or block 104), the candidate virtual build volume, wherein the evaluation comprises evaluating if each object is separated from a neighboring object by at least a first predefined separation distance and evaluating if a first portion of the first object is separated from a neighboring object by at least a second predefined separation distance.

In some examples, unless the object fulfils the separation criteria described in relation to block 106, a candidate virtual build volume may fail inspection and be disregarded. In some examples, blocks 104 and 106 may be carried out iteratively, with different candidate build volumes. This may allow suitable candidate build volume(s) to be identified and utilized in additive manufacturing.

Evaluation of candidate virtual build volume have been proposed, which may seek to meet and/or to optimize (in some examples, within constraints) certain criteria. For example, such candidate build volumes may be evaluated to determine that certain criteria are met. For example, the criteria may comprise a determination that the objects are non-overlapping, and that they are separated in space. A threshold separation may be specified to ensure that objects do not merge during object generation. In addition, in particular when additive manufacturing processes use or generate heat, objects may be separated to provide at least a degree of thermal isolation between objects. For example, where fusing agent is applied to a layer which is then heated, this may result in the portion of the built material which received fusing agent reaching a fusing temperature. However, when there is also nearby heating from another close object, the temperature in an area around that to which the fusing agent is applied may also reach its fusing temperature, resulting in a deformity, often in the form of a 'bulge', being formed in the object.

The method of FIG. 1 allows different object separations to be specified for a single object. For example, as further set out below, a greater distance may be specified for object portions which are identified as being associated with a high intended manufacturing accuracy.

In addition, in some examples, an evaluation of the packing efficiency, i.e. how efficiently the space available in a build volume is utilized, may be carried out. Candidate virtual build volumes may be compared such that the build volume in which a certain number of objects can be generated in a minimum height is identified, as the lower the height of the build volume, the faster the build volume may be generated.

In such cases, 'nesting' analysis has, for example, been carried out to converge on a selected candidate virtual build volume which seeks to minimize a target function which depends on parameters such as the height of the virtual build volume, the number of objects contained within the build volume and/or the density of packing. In some examples, this is carried out by determining a random initial solution, and generating a score for the candidate virtual build volume based on a predetermined target function. The candidate virtual build volume may then be 'shuffled', for example by applying a random rotation to object(s) (and in some examples, validating that the new object placement remains inside the printable volume and does not result in an intersection between objects), and the shuffled candidate virtual build volume is then scored again. As is further set out below, this process may continue until, for example, a threshold parameter is achieved, or the best score (for example the minimum or maximum score) after a predetermined number of iterations may be selected.

The method of FIG. 1 allows more than one separation criteria to be considered. By allowing some object portions (e.g. those which are not associated with a high intended manufacturing accuracy) to be separated by a smaller distance, an increased packing density may be achieved. However, where dimensional accuracy is known to be of greater importance, increased separation distances may assist in ensuring that an object is not deformed by the proximity of a neighbor.

Figure 2:
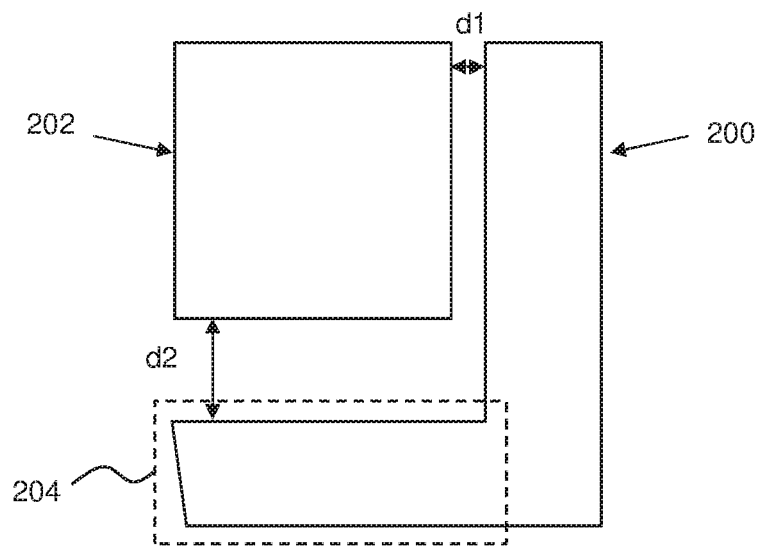
FIG. 2 is a schematic diagram of an example print bed indicating object placements.

FIG. 2 shows a schematic representation of a plurality of objects, 200, 202. A first object 200 comprises a sub-portion 204 which, in this example, is associated with a high degree of intended dimensional accuracy. This may for example be specified in object model data, or indicated by user input and identified by a processing apparatus accordingly, or may be indicated in some other way. For example, the sub-portion associated with a high degree of intended dimensional accuracy may comprise a part of the object which is intended to fit or match another part, or is intended to interact in a precise way with other parts or an environment in which the object is to be used. Such a sub-portion may comprise the first portion of the first object discussed in relation to FIG. 1 above. The second object 202 does not contain such an identified sub-portion.

The method of FIG. 1 may be carried out to ensure that, while other portions of the object 200 may be separated from the second object 202 by a relatively small distance d1, the sub-portion 204 is separated from the second object by a larger distance d2. For example, while the minimum intended separation between the objects may be, for example, at least 0.5 mm, 1 mm, or 2 mm, the sub-portion 204 may be separated from the second object 202 by at least, for example, 4 to 6 mm. While the example of FIG. 2 demonstrates the principle in two dimensions, the same principle may be applied in three dimensions.

By applying the larger separation to only those sub-portions of objects which are identified as being of high intended dimensional accuracy, a build volume as a whole may be more closely packed.

As noted above, in some examples, the process of FIG. 1 may be carried out iteratively, with new candidate virtual build volumes being determined and evaluated repeatedly until, for example, a predetermined criteria is reached (e.g., the first and second separation distances are appropriately realized) and until a sufficiently optimized object batch is identified. In some examples, this may comprise carrying out the method until a certain number of evaluations has been carried out, at which point the best scoring candidate virtual build volume may be adopted as a selected build volume. In some examples, the predetermined criteria relates to a rate of change of the result of the evaluation. For example, the method may iterate until a rate of change of the evaluation output is lower than a predetermined threshold (or in other words, until new candidate virtual build volumes do not produce significant improvements over previously evaluated candidate virtual build volumes).

In some examples, as further set out below, there may be at least one constraint placed on the re-arrangement of objects within the candidate virtual build volumes.

Figure 3:
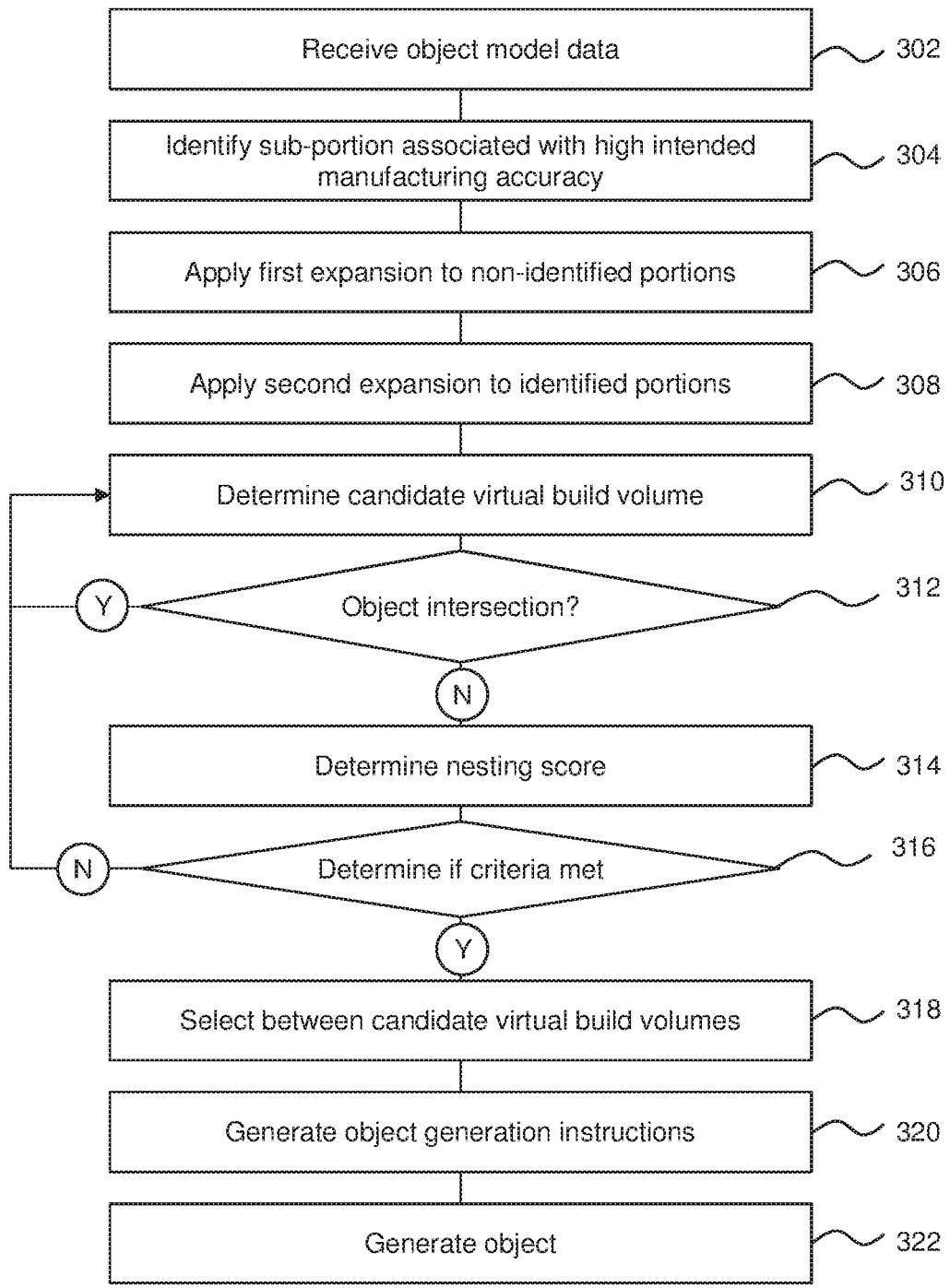
FIG. 3 is an example method of generating an object in additive manufacturing.

FIG. 3 shows an example of a process which may be carried out to identify a virtual build volume from which to generate object generation instructions, and to generate such instructions (which portions of the method may be computer implemented), and then to generate an object.

Block 302 comprises receiving object model data describing a plurality of objects to be generated in additive manufacturing. This may for example comprise receiving object model data as described in relation to block 102 above.

Block 304 comprises identifying, for at least one object, a sub-portion of that object which is associated with a high intended manufacturing accuracy. In some examples, this information may be provided with the object model data. In other examples, the information may be indicated by user input or the like, and identified by a processing apparatus accordingly. Such sub-portions may comprise the first portion of the first object discussed in relation to FIG. 1 above.

Block 306 comprises modifying the object data in relation to each object by applying a first expansion (for example, an offset or dilation or scaling factor which enlarges the object portion) to object portions which are not identified in block 304 and block 308 comprises applying a second expansion to object portions which have been identified in block 304. In this example, the first expansion is half the first predefined separation distance and the second expansion is the second predefined separation distance less half the first predefined separation distance.

Block 310 comprises determining a candidate virtual build volume indicating a possible placement and orientation of the objects as represented by the modified object data derived in blocks 306 and 308.

Block 312 comprises evaluating the candidate build volume by determining if the virtual volumes occupied by virtual objects modelled by the modified object data intersect with one another. If an intersection is found, the method returns to block 310, with a different placement and orientation of the objects. In some examples, the rotations and translations applied when re-arranging the objects may be constrained. For example, rotations may be 90° rotations, or 45° rotations but before range of rotation angles may not be accessible. This may assist in limiting the search area in identifying a suitable virtual build volume from the candidate virtual build volumes.

If however no intersection is found, it may be determined that the objects are separated by at least the first predetermined distance and that the identified sub-portions, which were enlarged by a greater amount, are separated by at least the second predetermined distance.

The method then may proceed to block 314, which comprises determining a nesting score. For example, a candidate virtual build volume may be assessed using an equation as set out below:

candidate_virtual_build_volume_nesting_score =

-continued
$$e^{\rho} * \left( \alpha * \frac{\sum_{i=0}^{n} Z_i}{n} + \beta * \frac{\max(Z)}{\vartheta} \right)$$

Where:
$\rho$=Number of objects which are omitted from candidate virtual build volume
$Z$=height of each object in the build volume, measured from the bottom of the build volume
$\vartheta$=Usable height of build volume
$\alpha$=Assigned importance of the average height
$\beta$=Assigned importance of the maximum height
$n$=number of objects The first term of the equation ($e^{\rho}$) seeks to optimize the number of objects in the build volume, and in this example, this is given the greatest weight in the output score by comparing the number of objects included with a target number of objects (with $\rho$ being the difference). The bracketed portion of the equation ranges from 0 to 1 and takes into account different parameters that affects the 'goodness' of the object arrangement of the candidate virtual build volume, including the average height of the objects in the build volume, and the total height as a proportion of the usable height. A score of 0 indicates a 'perfect' packing.

Of course, this is just one example of an equation which could be used and, depending on the intended use case, the basis of an evaluation may change. For example, an evaluation may comprise evaluating object placement with respect to boundaries of the build chamber, such that, for example, identifying that an object is placed close to a fabrication chamber (which regions may be associated with poor thermal characteristics) may negatively impact an evaluation.

For example, candidate_virtual_build_volume_nesting_score as set out above may be evaluated, with $\alpha$ and $\beta$ being selected, for example according to user priorities or default parameters.

In another example, a target function may be intended to produce a value between 1 and 0, where 1 or 0 represents a perfect score in which all objects are arranged such that height is minimized and a packing density is maximized. These different criteria may take different weights within the function depending on the priorities of a user, default parameters or the like. For the sake of a simple example, 50% of the value may represent the contribution from how close the height is to the minimum height and 50% may relate to the packing density. Other proportions may be selected in other examples. For example, where high-speed is the priority, more weight may be given to the height of the virtual build volume.

While in this example, if the objects do not meet the separation criteria, the build volume is disregarded altogether, in other examples, this may instead negatively impact the score of the candidate build volume.

Block 316 comprises determining whether a predetermined criteria has been met. For example, such criteria may comprise carrying out a predetermined number of evaluations, identifying that a rate of change of an output of the nesting score is lower than a predetermined threshold and/or achieving some other predetermined criteria. If the predetermined criteria has not been met, the method loops back to block 310, again with a different placement of virtual objects.

If however the criteria is met, the method proceeds to block 318, which comprises selecting between the pluralities of candidate virtual build volumes based on the evaluation. For example, this may comprise selecting, in some examples automatically, the candidate virtual build volume based on a lowest or highest score (which may depend on the evaluation scheme used) or in some other way.

Block 320 comprises generating object generation instructions based on the selected virtual build volume. For example, generating object generation instructions may comprise determining 'slices' of the selected virtual build volume, and rasterizing these slices into pixels (or voxels, i.e. three-dimensional pixels). An amount of print agent (or no print agent) may be associated with each of the pixels/voxels. For example, if a pixel relates to a region of a build volume which is intended to solidify, the print instructions may be generated to specify that fusing agent should be applied to a corresponding region of build material in object generation. If however a pixel relates to a region of the build volume which is intended to remain unsolidified, then object generation instructions may be generated to specify that no agent, or a coalescence modifying agent such as a detailing agent, may be applied thereto. In addition, the amounts of such agents may be specified in the generated instructions and these amounts may be determined based on, for example, thermal considerations and the like.

Block 322 comprises generating (or printing) the objects according to the generated object generation instructions. For example, the objects may be generated in a layer-wise manner. For example, this may comprise forming a layer of build material, applying print agents, for example through use of 'inkjet' liquid distribution technologies in locations specified in the object generation instructions for an object model slice corresponding to that layer, and using at least one print agent applicator, and applying energy, for example heat, to the layer. Some techniques allow for accurate placement of print agent on a build material, for example by using printheads operated according to inkjet principles of two dimensional printing to apply print agents, which in some examples may be controlled to apply print agents with a resolution of around 600 dpi, or 1200 dpi. A further layer of build material may then be formed and the process repeated, for example with the object generation instructions for the next slice.

In FIG. 3, expansions were applied to determine the first and second separation distances were met. However, in other examples, other techniques may be used to carry out the validation of block 106. In another example, the minimum separation distance between each of a plurality of objects may be determined and compared to at least one of the first predefined separation distance and the second predefined separation distance. If the minimum determined separation distance is at least the applicable one of the first and second separation distance, then it may be determined that the intended spacing has been observed.

In one such alternative, each object may be assessed in turn. Such an example is described in relation to FIG. 4, in which the objects are considered in turn using an object index.

Figure 4:
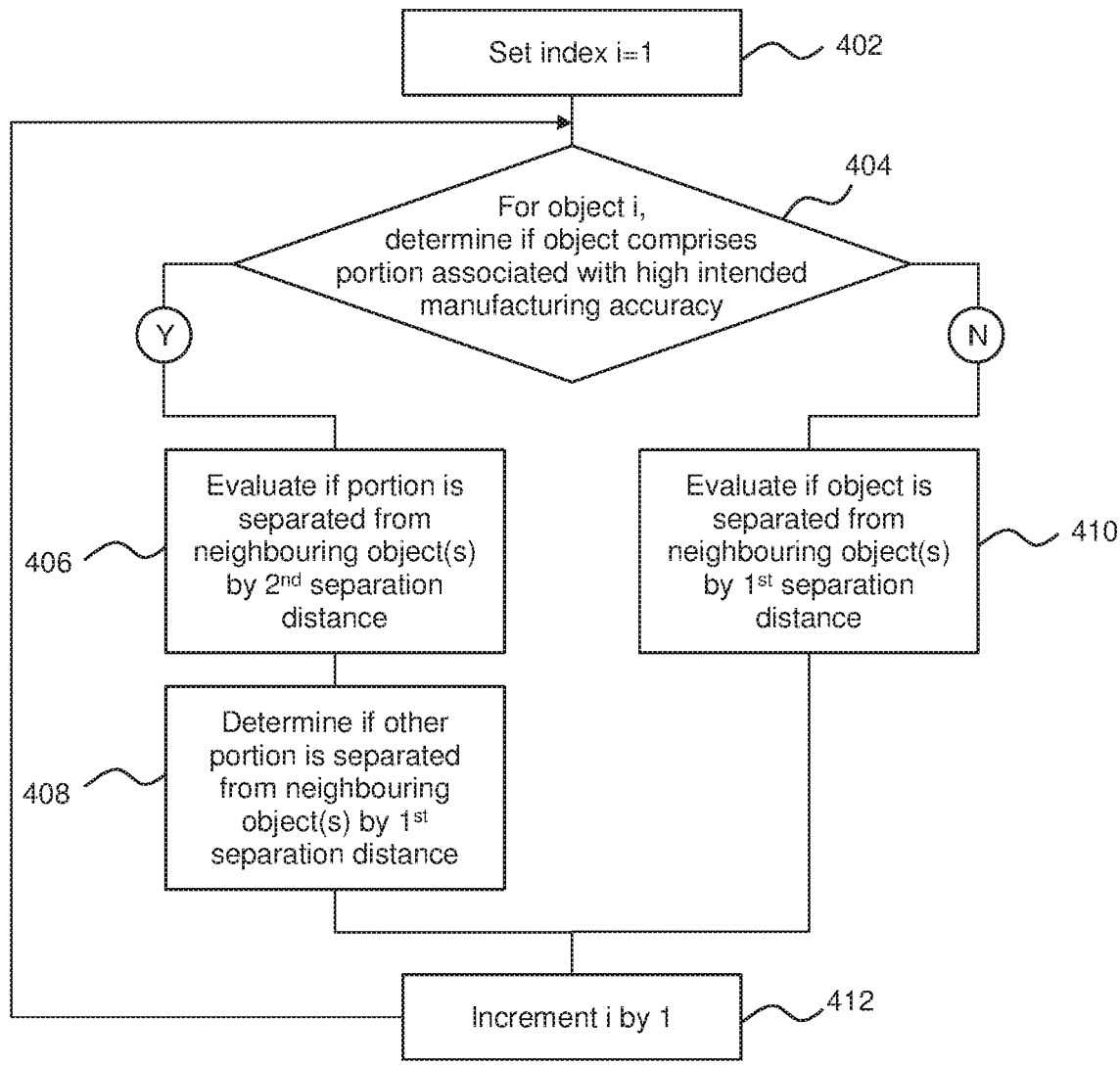
FIG. 4 is an example method of evaluating candidate build volumes.

FIG. 4 comprises, in block 402, setting an index i to 1. Block 404 comprises, for an object i of a plurality of objects represented in a candidate virtual build volume, determining if that object comprises an object portion which is associated with a high intended manufacturing accuracy. If so, the method branches to block 406, which comprises evaluating if that object portion is separated from any neighboring object(s) by the second predefined separation distance. The method then continues to block 408 which comprises determining for at least one other object portion if that other object portion is separated from any neighboring object(s) by the first predefined separation distance. If however the determination in block 404 is negative, the method proceeds to block 410, which comprises evaluating if the object is separated from any neighboring object(s) by the first predefined separation distance.

The method then merges to block 412, which comprises incrementing the value of i by 1 and the method loops back to block 404 until all objects have been evaluated.

In some examples, there may be a third branch in which objects which are wholly associated with a high intended manufacturing accuracy are considered. Such object may be evaluated to determine if it is separated from a neighboring object by the second predefined separation distance.

In some examples, this may be followed by determining a nesting score for candidate virtual build volumes in which applicable first and/or second object separations distances are respected.

Figure 5:
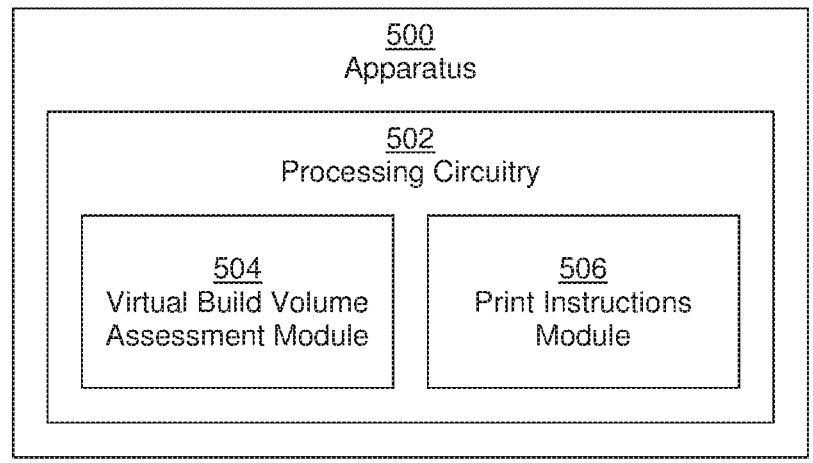
FIGS. 5 and 6 are examples of apparatus for use in additive manufacturing.

FIG. 5 shows an example of apparatus 500 comprising processing circuitry 502. The processing circuitry 502 comprises a virtual build volume assessment module 504 and a print instructions module 506.

In use of the apparatus 500, the virtual build volume assessment module 504 assesses a set of candidate virtual build volumes modelling possible fabrication chamber contents for object generation based on an analysis of whether the objects are separated by a first separation distance and whether a predefined object portion is separated from a neighbor object by a second separation distance, greater than the first separation distance. For example, this assessment may be carried out as described for the evaluation in block 106 or in relation to the method of FIG. 3 or 4.

The print instructions module 506, in use of the apparatus 500, determines print instructions (or object generation instructions) for generating the object based on a virtual build volume of the set of candidate virtual build volumes which is selected following assessment by the virtual build volume assessment module 504. For example, the virtual build volume assessment module 504 may select a candidate build volume which satisfies the minimum spacing requirements, and/or may score the candidate virtual build volumes and the best scoring candidate virtual build volume may be selected. For example, the virtual build volume assessment module 504 may assess (or analyze) the set of candidate virtual build volumes based on at least one of a height of each candidate virtual build volume and a number of objects in each candidate virtual build volume. In other words, in addition to taking into account whether the first and second separation distances are respected, other criteria may be assessed, for example as part of an optimization problem (or partial optimization problem) in evaluating a virtual build volume. In some examples, these may have associated relative influences on a function such that each can be given a relative importance.

Figure 6:
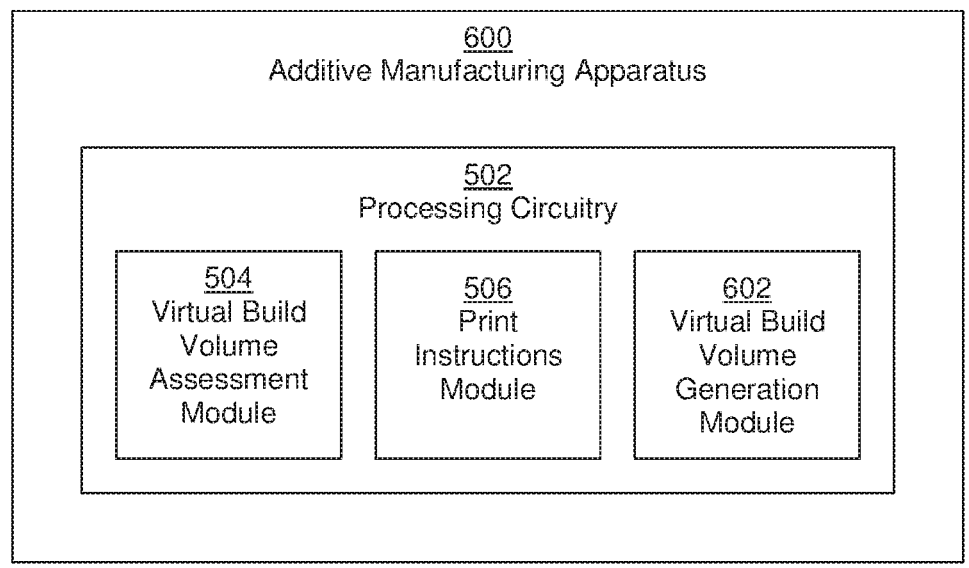

FIG. 6 shows an example of an additive manufacturing apparatus 600, which comprises the processing apparatus 502 of FIG. 5, which processing circuitry 502 further comprises, in this example, a virtual build volume generation module 602 to generate a set of candidate build volumes by rearranging a set of virtual objects.

The additive manufacturing apparatus 600 may comprise additional apparatus for generating objects in additive manufacturing not shown herein. For example, the additive manufacturing apparatus 600 may comprise any or any combination of a fabrication chamber in which at least one object may be generated, a print bed, print agent applicator(s) such as printhead(s) for distributing print agents, a build material distribution system for providing layers of build material, energy sources such as heat lamps and the like, which are not described in detail herein.

Figure 7:
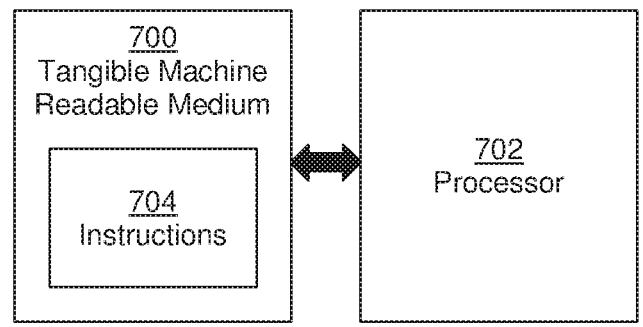
FIG. 7 is a simplified schematic diagram of a machine-readable medium in association with a processor, according to one example.

FIG. 7 shows an example of a tangible machine readable medium 700 in association with a processor 702. The machine readable medium 700 stores instructions 704 which, when executed, cause the processor 702 to carry out certain operations. In this example, the instructions 704 comprise instructions to cause the processor 702 to evaluate a plurality of possible object generation arrangements based on a default separation distance and an enhanced separation distance, wherein the enhanced separation is used to assess predefined object sub-portions. The evaluation may comprise analyzing, for example scoring, the plurality of possible object generation arrangements. The enhanced separation distance may be greater than the default separation distance. The default separation distance may be the first separation distance as set out above. The enhanced separation distance may be the second separation distance as set out above. In some such examples, the instructions 704 may cause the processor 702 to carry out block 106, block 312 or any of blocks 404-410 described above. For example, the possible object generation arrangements may be characterized as candidate virtual build volumes as described above.

In some examples, the instructions 704 may further comprise instructions to cause the processor 702 to identify the predefined object sub-portions as those sub-portions which are associated with a high intended dimensional accuracy. In some examples, the instructions 704 may further comprise instructions to cause the processor 702 to generate possible object generation arrangements (e.g. candidate virtual build volumes). In some examples, as set out above, the instructions may apply rotation(s) (e.g. a predetermined number of rotations) to the aligned objects to generate different object orientations.

In other examples, the instructions 704 may comprise instructions to carry out any of the blocks of the method of FIG. 1 or FIG. 4 and/or of the method blocks 302-320 of FIG. 3. In some examples, the instructions 704 may comprise instructions to cause the processor 702 to act as the virtual build volume assessment module 504, the print instructions module 506 and/or the virtual build volume generation module 602.

Examples in the present disclosure can be provided as methods, systems or machine-readable instructions, such as any combination of software, hardware, firmware or the like. Such machine-readable instructions may be included on a computer readable storage medium (including but not limited to disc storage, CD-ROM, optical storage, etc.) having computer readable program codes therein or thereon.

The present disclosure is described with reference to flow charts and block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each block in the flow charts and/or block diagrams, as well as combinations of the blocks in the flow charts and/or block diagrams can be realized by machine readable instructions.

The machine-readable instructions may, for example, be executed by a general-purpose computer, a special purpose computer, an embedded processor or processors of other programmable data processing devices to realize the functions described in the description and diagrams. In particular, a processor or processing apparatus may execute the machine-readable instructions. Thus, functional modules of the apparatus and devices (for example the virtual build volume assessment module 504, the print instructions module 506 and/or the virtual build volume generation module 602) may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine-readable instructions may also be stored in a computer readable storage that can guide the computer or other programmable data processing devices to operate in a specific mode.

Such machine-readable instructions may also be loaded onto a computer or other programmable data processing devices, so that the computer or other programmable data processing device(s) perform a series of operations to produce computer-implemented processing, thus the instructions executed on the computer or other programmable devices realize functions specified by block(s) in the flow charts and/or in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited only by the scope of the following claims and their equivalents. It should be noted that the above-mentioned examples illustrate rather than limit what is described herein, and that those skilled in the art will be able to design many alternative implementations without departing from the scope of the appended claims.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method comprising:
    receiving, by a processor, object model data describing a plurality of objects to be generated by an additive manufacturing device having a build volume, the objects including a first object;
    identifying, by the processor, one or more portions of the first object that are associated with an intended manufacturing accuracy greater than a threshold corresponding to high manufacturing accuracy;
    determining, by the processor, a candidate virtual build volume corresponding to the build volume of the additive manufacturing device, the candidate virtual build volume indicating a potential placement of the objects in the build volume when generated by the additive manufacturing device;
    evaluating, by the processor, the candidate virtual build volume, by:

determining whether each object is separated from a neighboring object by at least a first predefined separation distance selected to maximize packing density of the objects within the build volume when generated by the additive manufacturing device; and determining whether the identified portions of the first object are separated from portions of neighboring objects to which the identified portions of the first object are closest by at least a second predefined separation distance greater than the first predefined separation distance and selected to ensure that the first object has increased dimensional accuracy at the identified portions when generated by the additive manufacturing device as compared to if the identified portions were separated from the portions of the neighboring objects by the first predefined separation distance; and in response to determining that each object is separated by at least the first predefined separation distance and that the identified portions of the first object are separated from the portions of the neighboring objects by at least the second predefined separation distance, causing, by the processor, the additive manufacturing device to generate the objects within the build volume according to the candidate build volume.

2. The method according to claim 1, wherein the candidate virtual build volume is one of a plurality of candidate virtual build volumes that are determined and evaluated, the method further comprising:

selecting, by the processor and based on evaluation of each candidate virtual build volume, one of the candidate virtual build volumes according to which the additive manufacturing device is to generate the objects.

3. The method according to claim 2, further comprising:

for each candidate build volume in which each object is separated by at least the first predefined separation distance and that the identified portions of the first object are separated from the portions of the neighboring objects by at least the second predefined separation distance, determining, by the processor, a nesting score, wherein the one of the candidate virtual build volumes according to which the additive manufacturing device is to generate the objects is selected as the candidate virtual build volume having the nesting score that is highest.

4. The method according to claim 2, wherein the potential placement of the objects within a first candidate virtual build volume varies from the potential placement of the objects within a second candidate virtual build volume in that each object is either or both of relatively translated and relatively rotated in the first candidate virtual build volume as compared to the second candidate virtual build volume.

5. The method according to claim 4, further comprising:

modifying, by the processor, the second candidate virtual build volume to generate the first candidate build volume by applying a first expansion to the identified portions of the first object and a second expansion to at least one other object portion of the first object.

6. A system comprising:

a processor; and a memory storing instructions executable by the processor to:

receive object model data describing a plurality of objects to be generated by an additive manufacturing device having a build volume, the objects including a first object;

identify one or more portions of the first object that are associated with an intended manufacturing accuracy greater than a threshold corresponding to high manufacturing accuracy;

determine a candidate virtual build volume corresponding to the build volume of the additive manufacturing device, the candidate virtual build volume indicating a potential placement of the objects in the build volume when generated by the additive manufacturing device;

evaluate the candidate virtual build volume by:

determining whether each object is separated from a neighboring object by at least a first predefined separation distance selected to maximize packing density of the objects within the build volume when generated by the additive manufacturing device; and determining whether the identified portions of the first object are separated from portions of neighboring objects to which the identified portions of the first object are closest by at least a second predefined separation distance greater than the first predefined separation distance and selected to ensure that the first object has increased dimensional accuracy at the identified portions when generated by the additive manufacturing device as compared to if the identified portions were separated from the portions of the neighboring objects by the first predefined separation distance; and in response to determining that each object is separated by at least the first predefined separation distance and that the identified portions of the first object are separated from the portions of the neighboring objects by at least the second predefined separation distance, cause the additive manufacturing device to generate the objects within the build volume according to the candidate build volume.

7. The system according to claim 6, wherein the candidate virtual build volume is one of a plurality of candidate virtual build volumes that are determined and evaluated, the instructions executable by the processor to further:

select, based on evaluation of each candidate virtual build volume, one of the candidate virtual build volumes according to which the additive manufacturing device is to generate the objects.

8. The system according to claim 7, wherein the instructions are executable by the processor to further:

for each candidate build volume in which each object is separated by at least the first predefined separation distance and that the identified portions of the first object are separated from the portions of the neighboring objects by at least the second predefined separation distance, determine a nesting score, wherein the one of the candidate virtual build volumes according to which the additive manufacturing device is to generate the objects is selected as the candidate virtual build volume having the nesting score that is highest.

9. The system according to claim 7, wherein the potential placement of the objects within a first candidate virtual build volume varies from the potential placement of the objects within a second candidate virtual build volume in that each object is either or both of relatively translated and relatively rotated in the first candidate virtual build volume as compared to the second candidate virtual build volume.

10. The system according to claim 9, wherein the instructions are executable by the processor to further:

modify the second candidate virtual build volume to generate the first candidate build volume by applying a first expansion to the identified portions of the first object and a second expansion to at least one other object portion of the first object.

11. The system according to claim 6, further comprising the additive manufacturing device.

12. A non-transitory computer-readable data storage medium storing program code executable by a processor to perform processing comprising:
   receiving object model data describing a plurality of objects to be generated by an additive manufacturing device having a build volume, the objects including a first object;
   identifying one or more portions of the first object that are associated with an intended manufacturing accuracy greater than a threshold corresponding to high manufacturing accuracy;
   determining a candidate virtual build volume corresponding to the build volume of the additive manufacturing device, the candidate virtual build volume indicating a potential placement of the objects in the build volume when generated by the additive manufacturing device;
   evaluating the candidate virtual build volume by:
      determining whether each object is separated from a neighboring object by at least a first predefined separation distance selected to maximize packing density of the objects within the build volume when generated by the additive manufacturing device; and
      determining whether the identified portions of the first object are separated from portions of neighboring objects to which the identified portions of the first object are closest by at least a second predefined separation distance greater than the first predefined separation distance and selected to ensure that the first object has increased dimensional accuracy at the identified portions when generated by the additive manufacturing device as compared to if the identified portions were separated from the portions of the neighboring objects by the first predefined separation distance; and
   in response to determining that each object is separated by at least the first predefined separation distance and that the identified portions of the first object are separated from the portions of the neighboring objects by at least the second predefined separation distance, causing the additive manufacturing device to generate the objects within the build volume according to the candidate build volume.

13. The non-transitory computer-readable data storage medium according to claim 12, wherein the candidate virtual build volume is one of a plurality of candidate virtual build volumes that are determined and evaluated, the processing further comprising:
   selecting, based on evaluation of each candidate virtual build volume, one of the candidate virtual build volumes according to which the additive manufacturing device is to generate the objects.

14. The non-transitory computer-readable data storage medium according to claim 13, wherein the processing further comprises:
   for each candidate build volume in which each object is separated by at least the first predefined separation distance and that the identified portions of the first object are separated from the portions of the neighboring objects by at least the second predefined separation distance, determining a nesting score,
   wherein the one of the candidate virtual build volumes according to which the additive manufacturing device is to generate the objects is selected as the candidate virtual build volume having the nesting score that is highest.

15. The non-transitory computer-readable data storage medium according to claim 13, wherein the potential placement of the objects within a first candidate virtual build volume varies from the potential placement of the objects within a second candidate virtual build volume in that each object is either or both of relatively translated and relatively rotated in the first candidate virtual build volume as compared to the second candidate virtual build volume.

16. The non-transitory computer-readable data storage medium according to claim 15, wherein the processing further comprises:
   modifying the second candidate virtual build volume to generate the first candidate build volume by applying a first expansion to the identified portions of the first object and a second expansion to at least one other object portion of the first object.

* * * * *